(12) United States Patent
Hasegawa (10) Patent No.: US 8,803,281 B2
(45) Date of Patent: Aug. 12, 2014

(54) SEMICONDUCTOR DEVICE

(71) Applicant: Hisashi Hasegawa, Chiba (JP)

(72) Inventor: Hisashi Hasegawa, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/628,137

(22) Filed: Sep. 27, 2012

(65) Prior Publication Data

US 2013/0082349 A1    Apr. 4, 2013

(30) Foreign Application Priority Data

Sep. 30, 2011    (JP) .................. 2011-218242
Aug. 1, 2012    (JP) .................. 2012-171416

(51) Int. Cl.
| | | |
|---|---|---|
| H01L 23/525 | (2006.01) | |
| H01L 23/52 | (2006.01) | |
| H01L 21/768 | (2006.01) | |
| H01L 21/70 | (2006.01) | |
| H01L 29/00 | (2006.01) | |
| H01L 21/82 | (2006.01) | |

(52) U.S. Cl.
USPC ........... 257/529; 257/209; 257/601; 257/528; 257/484; 257/530; 438/132; 438/467; 438/215; 438/601

(58) Field of Classification Search
CPC ............... H01L 23/5258; H01L 2924/00014; H01L 23/5256; H01L 2224/05624; H01L 23/585; H01L 23/564; H01L 2224/45124; H01L 2224/45144; H01L 27/10894

USPC ........... 257/529, E23.15, E23.149, 209, 409, 257/528, 484, 530, 620; 438/132, 601, 467, 438/215, 281, 382

See application file for complete search history.

(56) References Cited

U.S. PATENT DOCUMENTS

| | | | | |
|---|---|---|---|---|
| 4,455,194 | A * | 6/1984 | Yabu et al. ..................... | 438/601 |
| 5,585,662 | A * | 12/1996 | Ogawa ......................... | 257/529 |
| 6,617,664 | B2 * | 9/2003 | Hayashi et al. ............... | 257/529 |
| 6,713,837 | B1 * | 3/2004 | Mori et al. .................... | 257/529 |
| 7,492,032 | B2 * | 2/2009 | Bang et al. .................... | 257/529 |
| 2002/0111004 | A1 * | 8/2002 | Suzuki et al. ................. | 438/601 |
| 2002/0145177 | A1 * | 10/2002 | Takasu et al. ................. | 257/529 |
| 2003/0168715 | A1 * | 9/2003 | Bae .............................. | 257/529 |

(Continued)

FOREIGN PATENT DOCUMENTS

| | | |
|---|---|---|
| JP | 05063091 | 3/1993 |
| JP | 07022508 | 1/1995 |

*Primary Examiner* — Shaun Campbell
*Assistant Examiner* — Thai T Vuong
(74) *Attorney, Agent, or Firm* — Adams & Wilks (57) ABSTRACT

A semiconductor device has a field insulating film provided on a semiconductor substrate, and a fuse provided on the field insulating film and having a fuse trimming laser irradiation portion and fuse terminals. The semiconductor device further includes an intermediate insulating film covering the fuse, a first TEOS layer on the intermediate insulating film, an SOG layer for planarizing the first TEOS layer, a second TEOS layer on the SOG layer and on the first TEOS layer, a protective film on the second TEOS layer, and an opening portion above the fuse trimming laser irradiation portion in a region from the protective film to the first TEOS layer. A seal ring is provided on the intermediate insulating film so as to surround the opening portion. The seal ring is disposed over the fuse so as to overlap each of the fuse terminals in plan view.

16 Claims, 9 Drawing Sheets

(56) References Cited

U.S. PATENT DOCUMENTS

| | | | |
|---|---|---|---|
| 2005/0212081 A1* | 9/2005 | Kang et al. | 257/529 |
| 2006/0087002 A1* | 4/2006 | Miwa et al. | 257/529 |
| 2006/0263987 A1* | 11/2006 | Fischer et al. | 438/281 |
| 2007/0102786 A1* | 5/2007 | Ido et al. | 257/529 |
| 2007/0114635 A1* | 5/2007 | Cho et al. | 257/529 |
| 2008/0081454 A1* | 4/2008 | Sakoh | 438/601 |
| 2008/0185678 A1* | 8/2008 | Kitajima | 257/529 |
| 2011/0227192 A1* | 9/2011 | Kitajima | 257/529 |

* cited by examiner

PRIOR ART

SEMICONDUCTOR DEVICE

RELATED APPLICATIONS

This application claims priority under 35 U.S.C. §119 to Japanese Patent Applications No. 2011-218242 filed on Sep. 30, 2011 and No. 2012-171416 filed on Aug. 1, 2012, the entire content of which is hereby incorporated by reference.

BACKGROUND OF THE INVENTION

1. Field of the Invention

The present invention relates to a semiconductor device including a MOS transistor and a resistor.

2. Description of the Related Art

In an analog IC such as a voltage detector, the following measures are typically taken for obtaining desired characteristics for an output voltage. Fuses for laser trimming, which are formed of thin film resistors such as polycrystalline silicon, are disposed, and the fuses are selectively burned and cut by laser irradiation to adjust a combination pattern of the resistors, to thereby adjust fluctuations in characteristics caused by fluctuations at mass production in a wafer process, and adjust a target value of a circuit.

Figure 4:
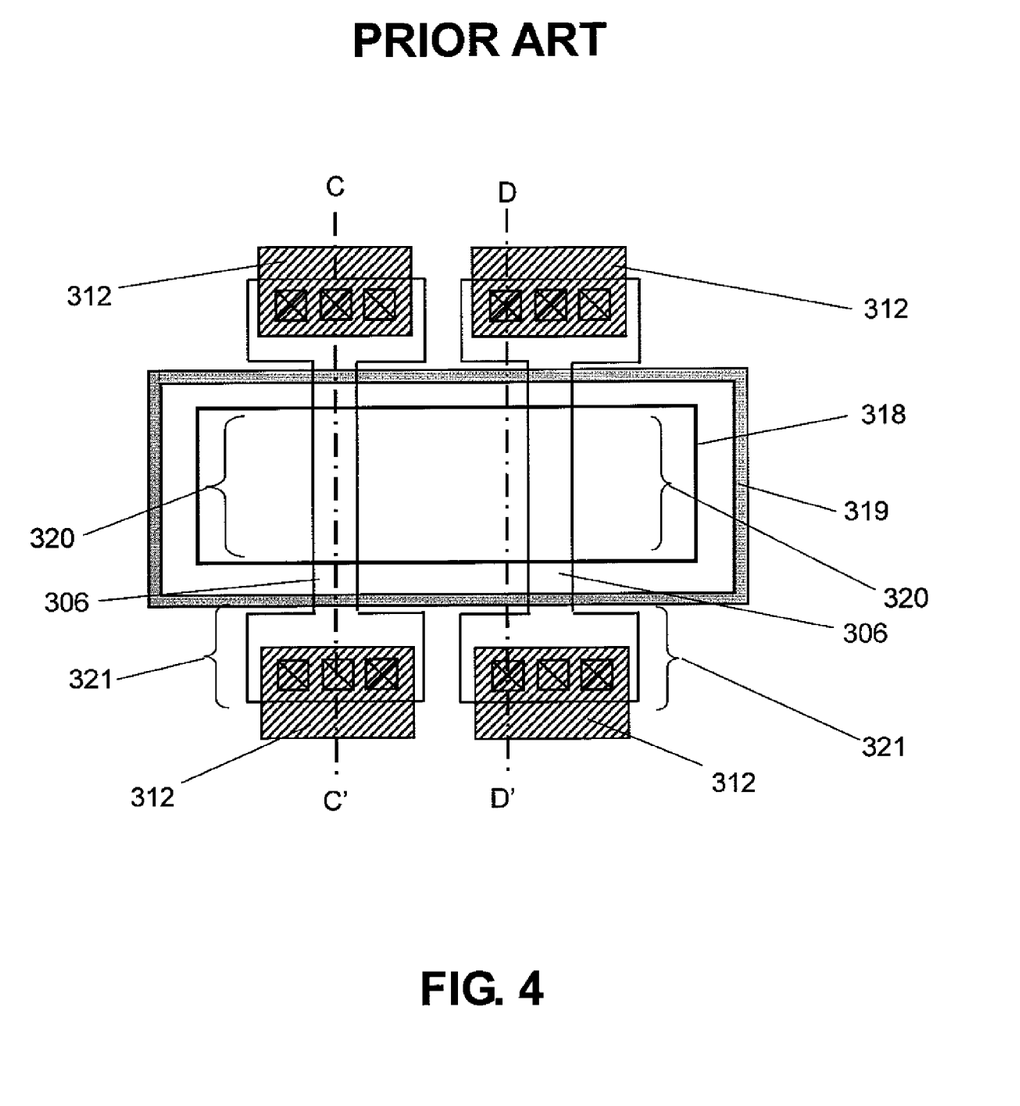
FIG. 4 is a schematic top view of a conventional fuse portion.
Figure 5:
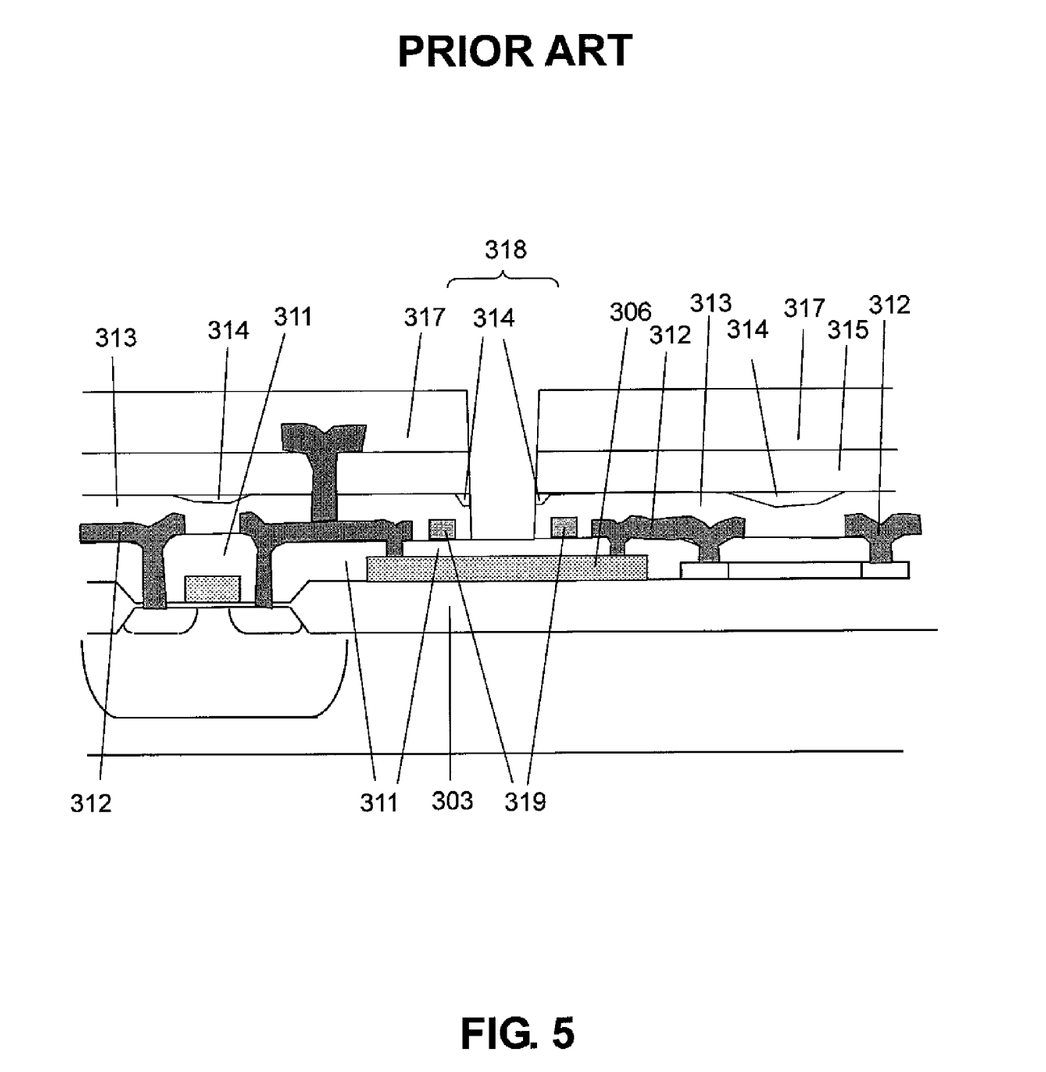
FIG. 5 is a schematic cross-sectional view of a conventional semiconductor device taken along the cut line C-C' of FIG. 4.
Figure 6:
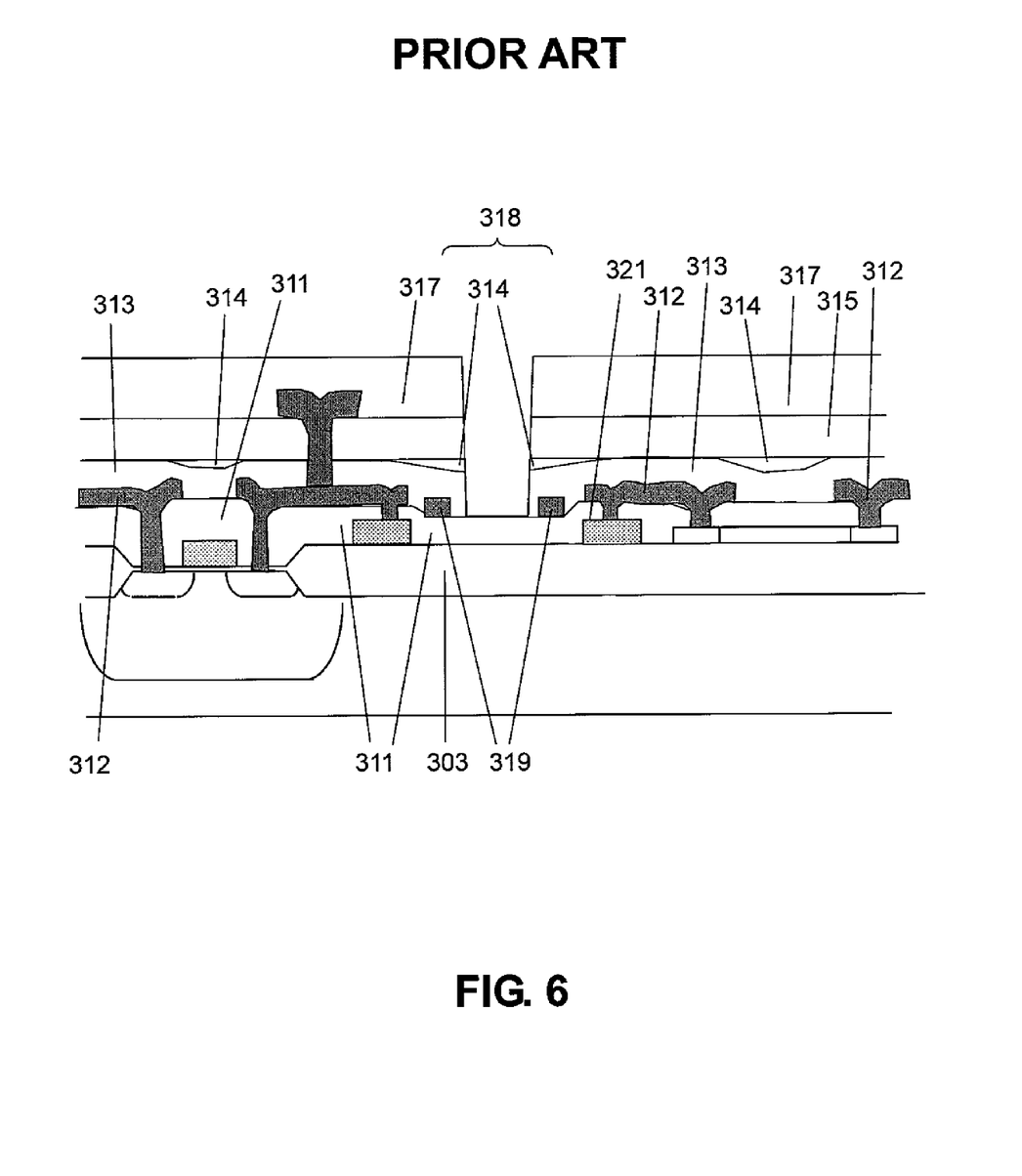
FIG. 6 is a schematic cross-sectional view of the conventional semiconductor device taken along the cut line D-D' of FIG. 4.

Referring to FIGS. 4 to 6, such a fuse for laser trimming in an analog IC is described. FIG. 4 is a top view, FIG. 5 is a schematic cross-sectional view taken along the cut line C-C', and FIG. 6 is a schematic cross-sectional view taken along the cut line D-D'. In order that laser may irradiate a fuse 306 made of a thin film resistor of polycrystalline silicon, a nitride film 317 as a protective film and interlayer insulating films 313 and 315 provided across multi-layered wirings are partly etched to form an opening portion 318. Accordingly, the side walls of the nitride film and the interlayer insulating films in the fuse opening portion are exposed. In a double-metal process or a further multi-layered wiring process, a known technology for planarization is a technology of performing etch back after coating, for example, an SOG layer 314 made of spin-on glass (SOG). In the etch back technology, however, the SOG layer 314 is present between the laminated interlayer insulating films, and hence moisture may enter through the SOG layer to cause fluctuations in element characteristics of an IC, resulting in a problem in terms of long-term reliability. Particularly in a PMOS transistor, a threshold voltage shift of the transistor occurs due to negative bias temperature instability (NBTI), which occurs when a negative gate bias is applied under a high temperature state.

As a countermeasure against the degradation in long-term reliability caused by the entering of moisture from the fuse opening portion, for example, Japanese Patent Publication Nos. H05-63091 and H07-22508 disclose a countermeasure for preventing the entering of moisture by forming a guard ring with the use of a metal so as to be a barrier on the inner side of the IC with respect to the fuse opening portion.

Referring to FIGS. 5 and 6, the entering of moisture through the SOG layer is described. FIG. 5 illustrates the cross section along the fuse 306. That is, FIG. 5 illustrates the cross section including a fuse trimming laser irradiation portion 320 of FIG. 4. Above the fuse 306, a seal ring 319 is formed through the intermediation of an intermediate insulating film 311. The SOG layer 314 between first TEOS (313) and second TEOS (315) is exposed in the fuse opening portion 318 but is disconnected by the seal ring 319, and hence the SOG layer 314 is never connected to an SOG layer 314 provided inside the IC. On the other hand, FIG. 6 illustrates the cross section excluding the fuse trimming laser irradiation portion 320. In this cross section, the fuse 306 has only a portion corresponding to a fuse terminal portion 321, and the portion corresponding to the fuse trimming laser irradiation portion 320 does not appear in FIG. 6 but the intermediate insulating film 311 is deposited directly on an underlaying field insulating film 303. Accordingly the seal ring 319 is formed at a position lower than a first metal wiring 312, with the result that the SOG layer 314 between the first TEOS 313 and the second TEOS 315 crosses over the seal ring 319 to be connected to the SOG layer 314 provided inside the IC. Thus, moisture enters the inside of the IC.

SUMMARY OF THE INVENTION

The present invention has been made in view of the above-mentioned problem, and it is an object thereof to propose a semiconductor device for preventing degradation in characteristics of an IC caused by entering of moisture from a fuse opening portion.

In order to achieve the above-mentioned object, according to a first aspect of the present invention, there is provided a semiconductor device, including: a semiconductor substrate; a field insulating film provided on the semiconductor substrate; a fuse provided on the field insulating film and made of polycrystalline silicon, the fuse including a fuse trimming laser irradiation portion to be subjected to laser trimming and fuse terminals provided on both sides of the fuse trimming laser irradiation portion; an intermediate insulating film for covering the fuse; a first TEOS layer provided on the intermediate insulating film; an SOG layer for planarizing the first TEOS layer; a second TEOS layer provided on the SOG layer and on the first TEOS layer which is not covered by the SOG layer; a protective film provided on the second TEOS layer; an opening portion provided above the fuse trimming laser irradiation portion in a region from the protective film to the first TEOS layer; and a seal ring made of a first layer of a metal wiring layer and provided on the intermediate insulating film so as to surround the opening portion. The fuse terminal is larger in width than the fuse trimming laser irradiation portion and extends to a lower portion of the seal ring.

Further, according to a second aspect of the present invention, in the semiconductor device according to the first aspect, a part of the fuse terminal extends to an inside of a region defined by the seal ring.

Further, according to a third aspect of the present invention, in the semiconductor device according to the first aspect, when a number of the fuses having the fuse trimming laser irradiation portions included in the seal ring is represented by N, and widths of the fuse trimming laser irradiation portions of the fuses are represented by $W_1$ to $W_N$, a total length L of the seal ring passing through above the fuse terminals satisfies an inequality $L > 2 \times (W_1 + \ldots + W_N)$.

In an IC having multi-layered wirings formed therein, a moisture entering path from the SOG layer between the laminated interlayer insulating films, which is a cause for degradation in long-term reliability, can be interrupted reliably from the fuse opening portion, and hence the degradation in characteristics of the IC caused by NBTI can be prevented.

DETAILED DESCRIPTION OF THE PREFERRED EMBODIMENT

Referring to the accompanying drawings, an embodiment of the present invention is hereinafter described.

Figure 1:
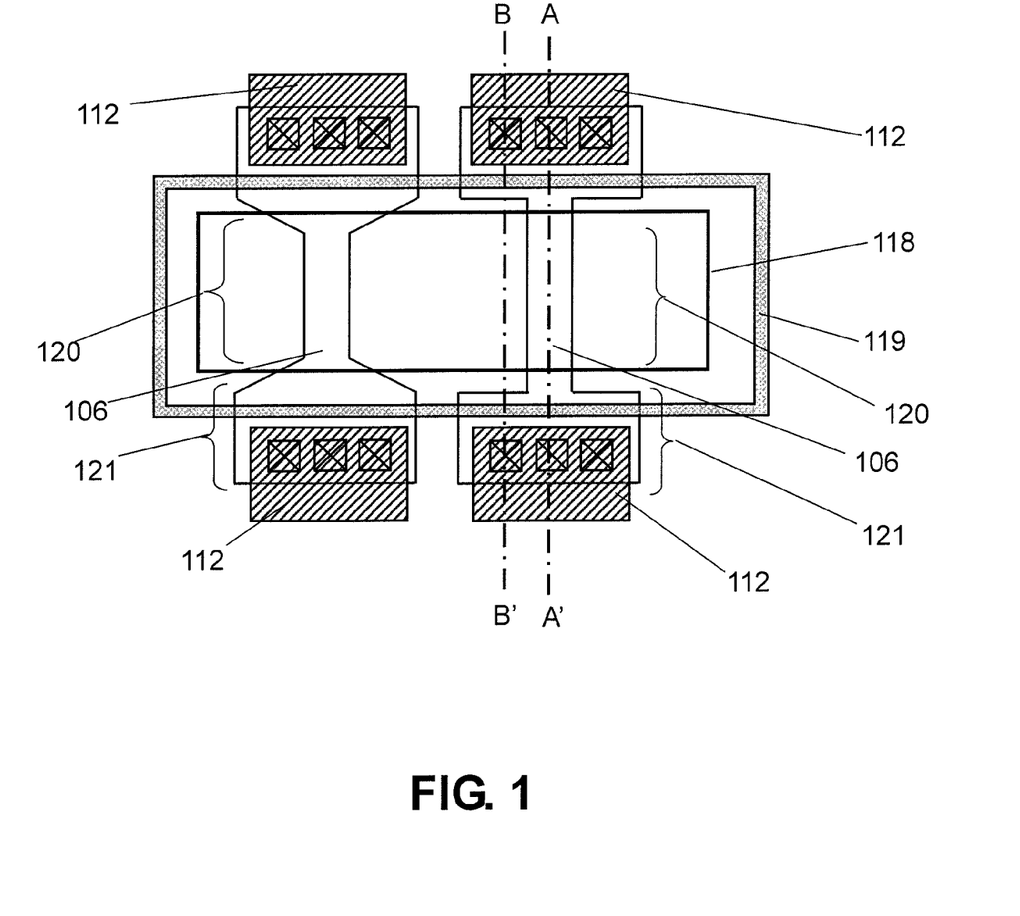
FIG. 1 is a schematic top view of a fuse portion of the present invention.
Figure 2:
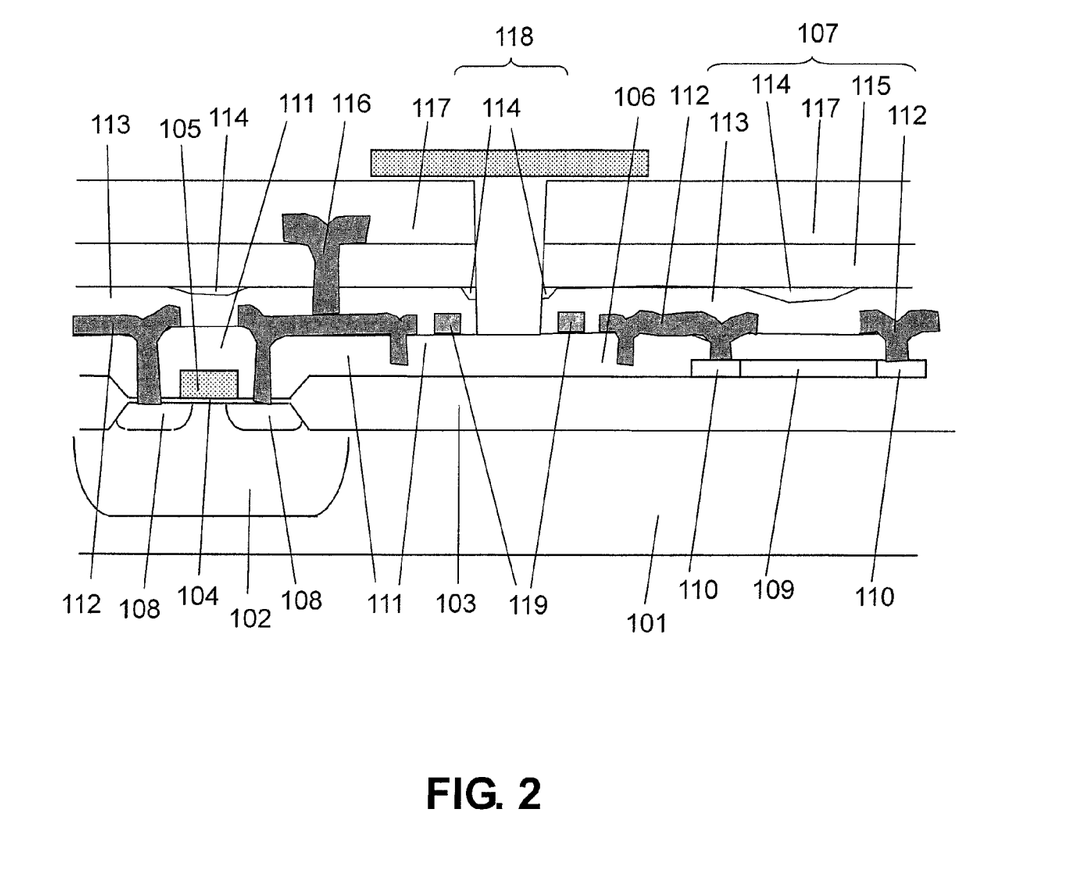
FIG. 2 is a schematic cross-sectional view of a semiconductor device according to the present invention taken along the cut line A-A' of FIG. 1.
Figure 3:
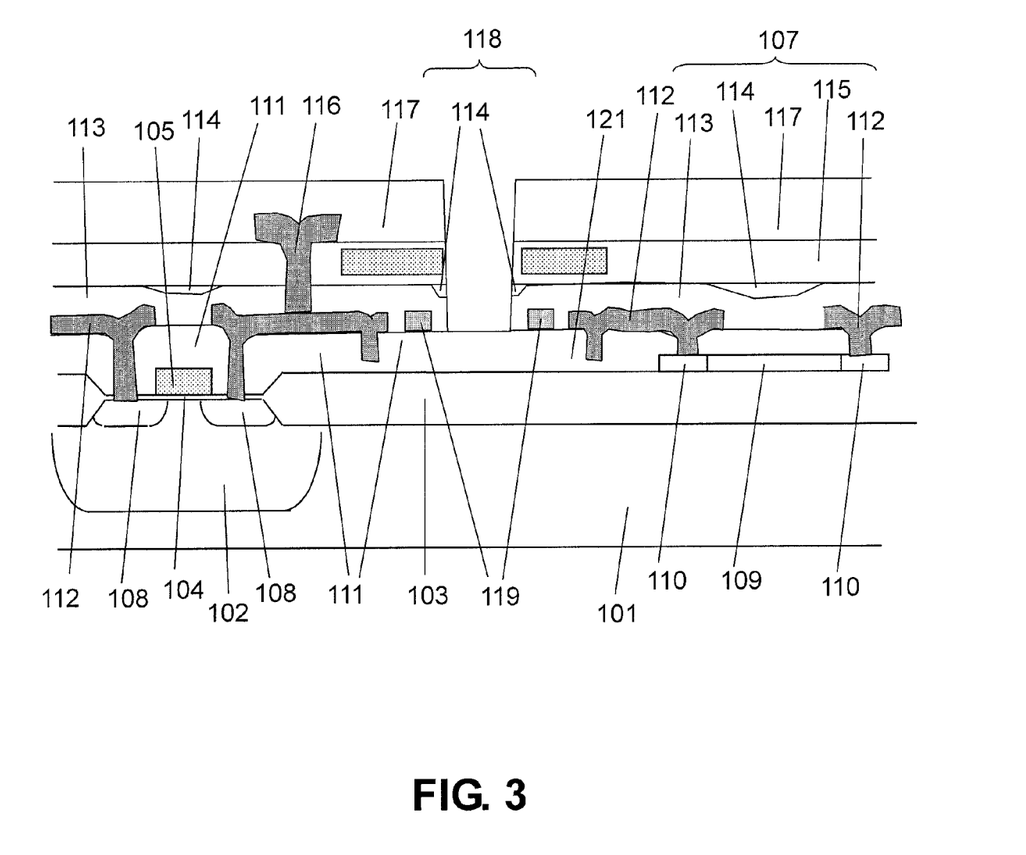
FIG. 3 is a schematic cross-sectional view of the semiconductor device according to the present invention taken along the cut line B-B' of FIG. 1.

FIG. 1 illustrates a top view of a fuse portion of a semiconductor device according to the present invention. FIGS. 2 and 3 illustrate schematic cross-sectional views of the semiconductor device according to the present invention.

It is found from comparison of FIG. 1 with FIG. 4 illustrating the conventional structure that the feature of the semiconductor device of the present invention resides in that a part of a fuse terminal 121 overlaps a part of a seal ring 119 made of a metal wiring layer which is the same as a metal wiring 112. A fuse 106 illustrated on the right side of FIG. 1 has a shape formed of the rectangular fuse terminals 121 and a rectangular fuse trimming laser irradiation portion 120 positioned in a fuse opening portion 118. A fuse 106 illustrated on the left side of FIG. 1 has a shape in which a bonding portion between the fuse terminal 121 and the fuse trimming laser irradiation portion 120 becomes thicker gradually from the fuse trimming laser irradiation portion 120 toward the fuse terminal 121. In both fuses 106, the fuse terminal 121 is larger in width than the fuse trimming laser irradiation portion 120, and the fuse terminal 121 and the seal ring 119 made of a first layer of the metal wiring layer are disposed so as to overlap each other in plan view.

FIG. 2 is a schematic cross-sectional view of the semiconductor device taken along the cut line A-A' of FIG. 1. The semiconductor device includes an N-type well diffusion layer 102 formed in a PMOS region on a P-type silicon semiconductor substrate 101, and a field insulating film 103 made of an oxide film formed by LOCOS.

The semiconductor device further includes a gate insulating film 104 formed by thermal oxidation, a gate electrode 105 made of an N-type or P-type polycrystalline silicon film, and the fuse 106 to be cut by laser trimming. The semiconductor device further includes a high-resistive resistor 107 made of second polycrystalline silicon. The high-resistive resistor 107 may be a P-type resistor or an N-type resistor.

The semiconductor device further includes P-type high impurity concentration regions 108 to become a drain and a source of a PMOS transistor, and, although not particularly illustrated, N-type high impurity concentration regions to become a drain and a source of an NMOS transistor. Simultaneously, in order to reduce the resistance at a contact portion of the resistor, high concentration regions 110 in which P-type or N-type impurities are simultaneously ion-implanted at high concentration are disposed on both sides of a low concentration region 109.

A first contact hole is formed in an intermediate insulating film 111, and a first metal wiring 112 is provided. At this time, the contact hole may have a plug structure embedded with a refractory metal such as tungsten. As the metal wiring 112, Al—Si, Al—Si—Cu, or Al—Cu may be used. Further, a barrier metal layer made of Ti or TiN may be placed under the metal for the purpose of preventing a spike at the contact.

In order to form multi-layered wirings, for example, TEOS layers formed by P-CVD are disposed as interlayer insulating films. On a first TEOS layer 113 as the interlayer insulating film, an SOG layer 114 is coated for improving the flatness and thereafter subjected to etch back. A second TEOS layer 115 as an insulating film is further provided, and the resultant film is obtained as a final interlayer insulating film.

A second contact hole is formed, and a second metal wiring 116 is disposed. As the metal wiring, for example, Al—Si, Al—Si—Cu, or Al—Cu may be used. In a protective film 117, the fuse opening portion 118 to become an opening for a pad and a fuse portion is provided, thereby completing a semiconductor device according to the embodiment of the present invention.

Above the fuse 106, the seal ring 119 is formed from the first layer of the metal wiring layer through the intermediation of the intermediate insulating film 111. The SOG layer 114 between the first TEOS layer 113 and the second TEOS layer 115 is exposed in the fuse opening portion 118 but is disconnected by the seal ring 119 disposed above the fuse 106. Thus, the SOG layer 114 exposed in the fuse opening portion 118 is never connected to an SOG layer 114 which is left inside an IC at a distance from the fuse opening portion.

FIG. 3 is a schematic cross-sectional view of the semiconductor device taken along the cut line B-B' of FIG. 1. In the fuse opening portion 118, the shape of the fuse 106 is different from that illustrated in FIG. 2. The fuse 106 does not have a portion corresponding to the fuse trimming laser irradiation portion 120, and the intermediate insulating film 111 is deposited on the underlaying field insulating film 103. The seal ring 119 is disposed above the fuse terminal portion 121 corresponding to an end portion of the fuse 106 through the intermediation of the intermediate insulating film 111. At this time, the metal wiring 112 bonded on the fuse terminal portion 121 has the same height as the seal ring 119. Accordingly, the SOG layer 114 between the first TEOS layer 113 and the second TEOS layer 115 is exposed in the fuse opening portion 118 but is disconnected above the seal ring 119, and hence the SOG layer 114 is never connected to an SOG layer 114 provided inside an IC.

It is noted that even in the shape of the fuse 106 illustrated on the left side of FIG. 1, polycrystalline silicon is formed below the seal ring 119, and hence the metal wiring 112 bonded on the fuse terminal portion has the same height as the seal ring 119 so as to disconnect the SOG layer. Thus, the entering of moisture through the SOG can be prevented, to thereby prevent the deterioration in characteristics of the IC caused by NBTI. In this case, when the number of fuses having the fuse trimming laser irradiation portions included in one closed seal ring is represented by N, and the widths of the fuse trimming laser irradiation portions of the respective fuses are represented by $W_1$ to $W_N$, it is found that a total length L of the seal ring passing through above the fuse terminals satisfies an inequality of $L>2\times(W_1+\ldots+W_N)$.

It is also possible to vary the shape of the fuse terminal portion 121 so that the polycrystalline silicon layer extending from the fuse terminal portion 121 may occupy most of the lower part of the seal ring 119. In this case, the entering of moisture can be further prevented. Further, it should be understood that the same effects can be obtained also when a polycrystalline silicon layer which is not connected to the fuse terminal portion is disposed below the seal ring 119.

Referring to FIGS. 7 to 10, a method of manufacturing the semiconductor device described with reference to FIGS. 1 to 3 is described next.

Figure 7:
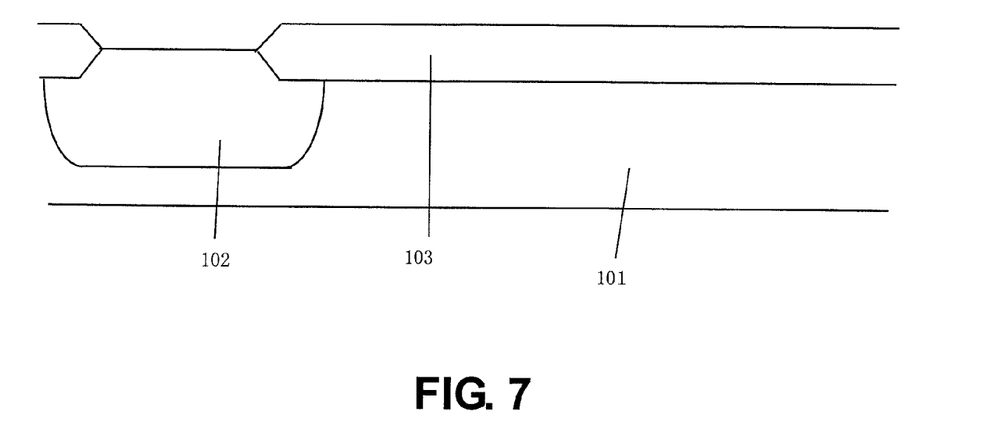
FIG. 7 is a view illustrating a step of manufacturing a semiconductor device according to the present invention.

First, as illustrated in FIG. 7, the N-type well diffusion layer 102 is formed in the PMOS region on the P-type silicon semiconductor substrate 101, and, although not particularly described, a P-type well diffusion layer is formed in an NMOS region. Then, the field insulating film 103 made of an oxide film is formed by LOCOS to have a thickness of about 4,000 to 8,000 Å, for example.

Figure 8:
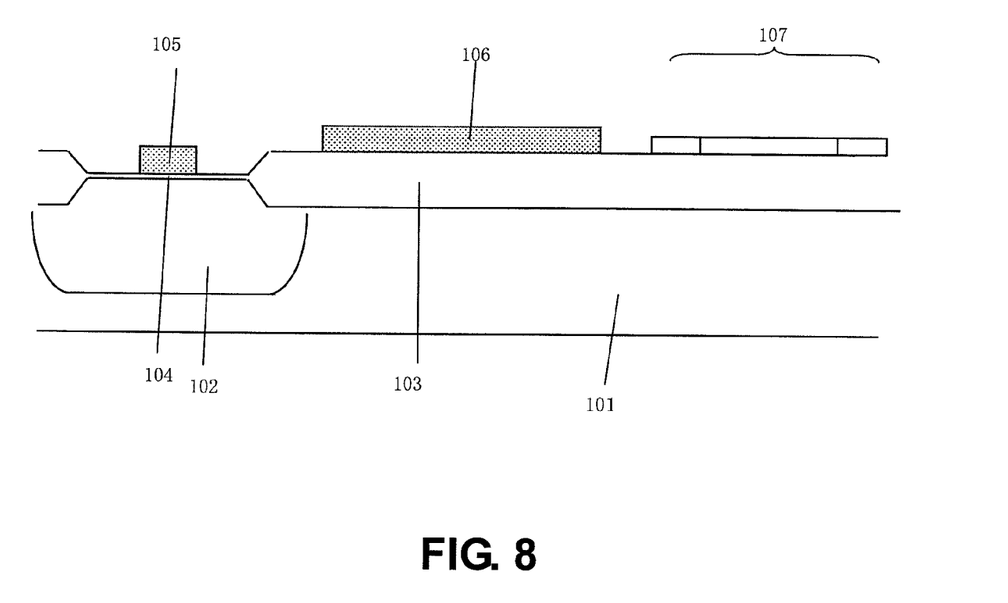
FIG. 8 is a view illustrating a step of manufacturing a semiconductor device according to the present invention, subsequent to FIG. 7.

Next, as illustrated in FIG. 8, the gate insulating film 104 is formed by thermal oxidation to have a thickness of about 100 to 400 Å, and ion implantation is performed so as to obtain a desired threshold voltage. After that, a polycrystalline silicon film to become the gate electrode is deposited by CVD, and patterning is performed with the use of a photoresist, to thereby form the gate electrode 105 and the fuse 106 to be cut by laser trimming. At this time, phosphorus or boron is diffused into the polycrystalline silicon film to become the gate electrode 105 and the fuse 106 by ion-implantation or doped-CVD so that the polarities of the electrodes are set to N-type or P-type polycrystalline silicon. After that, the second polycrystalline silicon is deposited, and impurities are implanted into the second polycrystalline silicon at low concentration so as to form a resistor. In this case, any of a P-type resistor and an N-type resistor may be formed. The resistor may be formed by doped-CVD. Then, after a photolithography step, etching is performed to form a pattern, to thereby form the high-resistive resistor 107.

Figure 9:
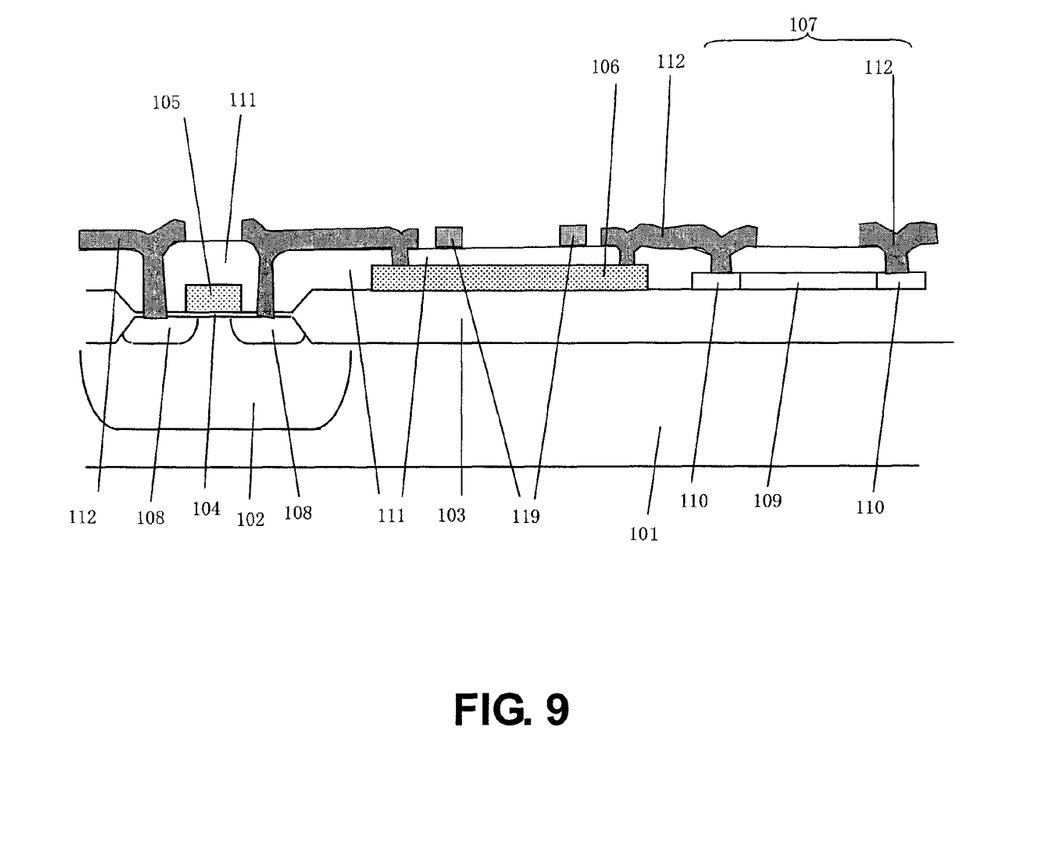
FIG. 9 is a view illustrating a step of manufacturing a semiconductor device according to the present invention, subsequent to FIG. 8.

Then, as illustrated in FIG. 9, the P-type high impurity concentration regions 108 to become the drain and the source of the PMOS transistor are formed, and, although not particularly illustrated, the N-type high impurity concentration regions to become the drain and the source of the NMOS transistor are formed. Further, in order to reduce the resistance at a contact portion of the resistor, P-type or N-type impurities are simultaneously ion-implanted at high concentration into the low concentration region 109 of the resistor, to thereby form the high concentration regions 110.

Subsequently, the first contact hole is formed after the intermediate insulating film 111 is formed, and then the first metal wiring 112 is deposited by, for example, sputtering. At this time, the contact hole may have a plug structure embedded with a refractory metal such as tungsten. As the metal wiring 112, Al—Si, Al—Si—Cu, or Al—Cu may be used. Further, a barrier metal layer made of Ti or TiN may be placed under the metal for the purpose of preventing a spike at the contact. Then, the first metal wiring 112 is formed in a photolithography and etching step.

Figure 10:
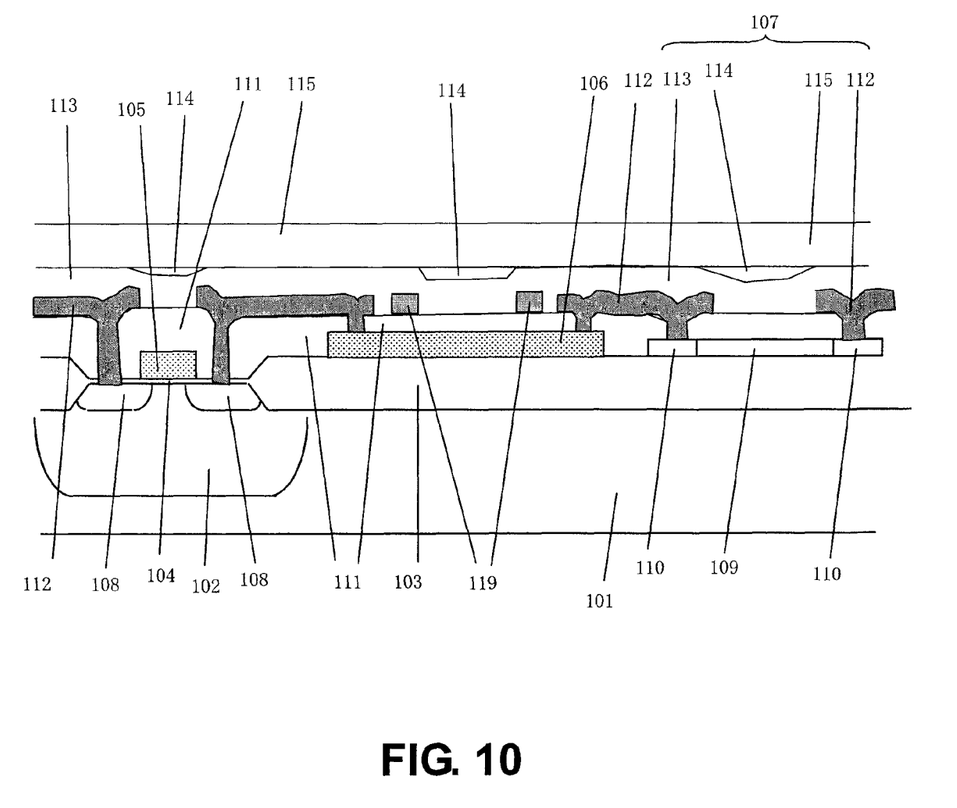
FIG. 10 is a view illustrating a step of manufacturing a semiconductor device according to the present invention, subsequent to FIG. 9.

After that, as illustrated in FIG. 10, in order to form multi-layered wirings, interlayer insulating films are formed of TEOS by P-CVD, for example. On the first TEOS layer 113 as the interlayer insulating film, the SOG layer 114 is coated for improving the flatness and thereafter subjected to etch back. The second TEOS layer 115 as an insulating film is further deposited, and the resultant film is obtained as a final interlayer insulating film.

After that, although not illustrated, the second contact hole is formed, and the second metal wiring 116 is formed. As the metal wiring, for example, Al—Si, Al—Si—Cu, or Al—Cu may be used. Through the formation of the protective film 117 and the formation of the opening 118 for the pad and the fuse portion, the semiconductor device illustrated in FIGS. 1 to 3 is formed.

What is claimed is:

1. A semiconductor device, comprising:
   a semiconductor substrate;
   a field insulating film provided on the semiconductor substrate;
   a fuse provided on the field insulating film and made of polycrystalline silicon, the fuse including a fuse trimming laser irradiation portion to be subjected to laser trimming and fuse terminals provided on both sides of the fuse trimming laser irradiation portion;
   an intermediate insulating film for covering the fuse;
   a first TEOS layer provided on the intermediate insulating film;
   an SOG layer for planarizing the first TEOS layer;
   a second TEOS layer provided on the SOG layer and on the first TEOS layer;
   a protective film provided on the second TEOS layer;
   an opening portion provided above the fuse trimming laser irradiation portion in a region from the protective film to the first TEOS layer; and
   a seal ring made of a first layer of a metal wiring layer and provided on the intermediate insulating film so as to surround the opening portion,
   wherein the fuse terminals are extended to exist under the seal ring.

2. A semiconductor device according to claim 1, wherein a polycrystalline silicon layer is extended from the fuse terminals to exist under the seal ring.

3. A semiconductor device according to claim 1, wherein each of the fuse terminals is provided with a portion that has a width wider than that of the fuse trimming laser irradiation portion and that is disposed directly under the seal ring.

4. A semiconductor device according to claim 1, wherein each of the fuse terminals is provided with a portion that has a width wider than that of the fuse trimming laser irradiation portion so that a length along which the seal ring extends over the fuse terminal is greater than the width of the fuse trimming laser irradiation portion.

5. A semiconductor device according to claim 1, wherein the fuse terminals are connected to the fuse trimming laser irradiation portion via respective intermediate portions that increase in thickness from the fuse trimming laser irradiation portion toward the fuse terminal.

6. A semiconductor device according to claim 5, wherein the intermediate portions extend into the opening portion.

7. A semiconductor device comprising:
   a semiconductor substrate;
   a field insulating film provided on the semiconductor substrate;
   a fuse provided on the field insulating film, the fuse having a fuse trimming laser irradiation portion configured to be subjected to laser trimming and fuse terminals provided on both sides of the fuse trimming laser irradiation portion;
   an intermediate insulating film covering the fuse;
   a first TEOS layer provided on the intermediate insulating film;
   an SOG layer for planarizing the first TEOS layer;
   a second TEOS layer provided on the SOG layer and on the first TEOS layer;

a protective film provided on the second TEOS layer;

an opening portion provided above the fuse trimming laser irradiation portion in a region from the protective film to the first TEOS layer; and a seal ring provided on the intermediate insulating film so as to surround the opening portion, the seal ring being disposed over the fuse so as to overlap each of the fuse terminals in plan view.

8. A semiconductor device according to claim 7, wherein the fuse is made of polycrystalline silicon and the seal ring is made of a metal wiring layer.

9. A semiconductor device according to claim 7, wherein each of the fuse terminals is provided with a portion that has a width wider than that of the fuse trimming laser irradiation portion and that is disposed directly under the seal ring.

10. A semiconductor device according to claim 7, wherein each of the fuse terminals is provided with a portion that has a width wider than that of the fuse trimming laser irradiation portion so that a length along which the seal ring extends over the fuse terminal is greater than the width of the fuse trimming laser irradiation portion.

11. A semiconductor device according to claim 7, wherein the fuse terminals are connected to the fuse trimming laser irradiation portion via respective intermediate portions that increase in thickness from the fuse trimming laser irradiation portion toward the fuse terminal.

12. A semiconductor device according to claim 11, wherein the intermediate portions extend into the opening portion.

13. A semiconductor device comprising:

a semiconductor substrate;

a field insulating film provided on the semiconductor substrate;

a fuse provided on the field insulating film, the fuse having a fuse trimming laser irradiation portion configured to be subjected to laser trimming and fuse terminals provided on both sides of the fuse trimming laser irradiation portion, each of the fuse terminals having a wider width that that of the fuse trimming laser irradiation portion;

an intermediate insulating film covering the fuse;

a first TEOS layer provided on the intermediate insulating film;

an SOG layer for planarizing the first TEOS layer;

a second TEOS layer provided on the SOG layer and on the first TEOS layer;

a protective film provided on the second TEOS layer;

an opening portion provided above the fuse trimming laser irradiation portion in a region from the protective film to the first TEOS layer; and a seal ring provided on the intermediate insulating film so as to surround the opening portion and extend over each of the fuse terminals, a length along which the seal ring extends over each of the fuse terminals being greater than the width of the fuse trimming laser irradiation portion.

14. A semiconductor device according to claim 13, wherein the fuse is made of polycrystalline silicon and the seal ring is made of a metal wiring layer.

15. A semiconductor device according to claim 13, wherein the fuse terminals are connected to the fuse trimming laser irradiation portion via respective intermediate portions that increase in thickness from the fuse trimming laser irradiation portion toward the fuse terminal.

16. A semiconductor device according to claim 15, wherein the intermediate portions extend into the opening portion.

\* \* \* \* \*